(12) United States Patent
Kang

(10) Patent No.: US 7,545,676 B2
(45) Date of Patent: Jun. 9, 2009

(54) WELL BIAS CIRCUIT IN A MEMORY DEVICE AND METHOD OF OPERATING THE SAME

(75) Inventor: Won Kyung Kang, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 11/760,768

(22) Filed: Jun. 10, 2007

(65) Prior Publication Data

US 2008/0062766 A1    Mar. 13, 2008

(30) Foreign Application Priority Data

Sep. 13, 2006    (KR) ...................... 10-2006-0088646

(51) Int. Cl.
*G11C 16/04* (2006.01)

(52) U.S. Cl. ............................. 365/185.18; 365/185.29; 365/185.25

(58) Field of Classification Search ............ 365/185.18, 365/185.29, 185.25
See application file for complete search history.

(56) References Cited

U.S. PATENT DOCUMENTS 6,031,774 A * 2/2000 Chung ......................... 365/204
7,224,624 B2 * 5/2007 Lee et al. ................ 365/189.05

FOREIGN PATENT DOCUMENTS

KR    1020000002889 A    1/2000
KR    100481841 B1    3/2005

* cited by examiner

*Primary Examiner*—Huan Hoang
(74) *Attorney, Agent, or Firm*—Townsend and Townsend and Crew LLP

(57) ABSTRACT

A well bias circuit in a memory device includes a well voltage supplying circuit configured to apply a high voltage to a well for erasing data in a memory cell. A well discharging circuit is configured to discharge the high voltage applied to the well in accordance with a first control signal after the data in the memory cell is erased. A well-to-ground circuit is configured to control the well bias to obtain a ground voltage in accordance with a second control signal. A control circuit is configured to activate the well discharging circuit for a predetermined time when power is turned on.

5 Claims, 4 Drawing Sheets

WELL BIAS CIRCUIT IN A MEMORY
DEVICE AND METHOD OF OPERATING THE
SAME

CROSS-REFERENCE TO RELATED
APPLICATIONS

This application claims priority from Korean Patent Application No. 2006-88646, filed on Sep. 13, 2006, the contents of which are incorporated herein by reference in its entirety.

BACKGROUND OF THE INVENTION

The present invention relates to a memory device and more particularly to a well bias circuit and a method of protecting the well bias circuit when a power supply is turned on after the power supply is abnormally turned off.

A nonvolatile semiconductor memory storage device maintains stored data even when the supply of power is stopped. Accordingly, the nonvolatile memory device is widely employed (e.g., in a computer, a memory card, etc).

A NAND flash memory device has higher density compared with a NOR flash memory device, and thus the NAND flash memory device is widely employed in a high integration flash memory device.

A memory cell array of the NAND flash memory device has a plurality of memory cells and a string where two select transistors, i.e. source select transistor (SST) and ground select transistor (GST) are connected in series. Here, the select transistors are connected to a bit line and a source line.

The select transistor (GST) performs a switching operation for connecting to a reference common line.

The select transistor (SST) switches a connection between the memory cell and the bit line for data input/output.

To read certain information from the memory cell, the NAND flash memory device applies a voltage of about 4.5V to gates of the select transistors SST and GLT, thereby turning on the select transistors SST and GLT. Then, in this condition, the NAND flash memory device applies a voltage of 0V to a word line of a selected memory cell, and applies a voltage of 4.5V to a word line of a memory cell which is not selected. As a result, the word line corresponding to the selected memory cell is activated. Accordingly, the NAND flash memory device may read information stored in the selected memory cell without effect of peripheral memory cells.

Additionally, to erase data of the memory cell in the memory device, a high voltage is applied to a substrate, i.e. well, and then data of a programmed memory cell is erased.

Hence, a circuit for applying a well bias has a first path through which a well bias having a high voltage is applied, and a second path through which the voltage of the well is discharged, wherein the first path is different from the second path. Further, the circuit includes a well bias circuit for controlling the well bias so that the well bias has always a ground voltage, e.g., 0V in case that an erase operation is not performed.

FIG. 1 is a view illustrating a common well bias circuit in the NAND flash memory.

In FIG. 1, the well bias circuit includes a well voltage supplying circuit 10, a well to ground circuit 20, a well discharging circuit 30 and a controller 40. Here, the well voltage supplying circuit 10 supplies a high voltage to a well so as to erase data of a memory cell (not shown), and the well to ground circuit 20 controls the well bias so that the well bias has a ground voltage, e.g., 0V when an erasing operation is not performed. In addition, the well discharging circuit 30 provides a discharge path so that the high voltage supplied to the well is discharged after the erasing operation, and the controller 40 outputs a controlling signal for controlling the operation of the well to ground circuit 20 and the well discharging circuit 30.

The well voltage supplying circuit 10 has a first snapback transistor Sb1 connected between an input terminal having the high voltage $V_{ERASE}$ and a node 1. Here, a switching controlling signal SW_HV is transmitted to a gate of the first snapback transistor Sb1, and the node 1 is connected to the well in the NAND flash memory. Additionally, the first snapback transistor Sb1 has characteristics for withstanding a high voltage, and thus other transistors having characteristics for withstanding the high voltage may be substituted for the first snapback transistor Sb1.

The well to ground circuit 20 includes a second inverter IN2, a third inverter IN3, and an N-MOS transistor N1.

The second and third inverters IN2, IN3 are connected in series between a first inverter IN1 (for inverting a well to ground inverting signal WELLTOGND_N) and a node 2.

The N-MOS transistor N1 is connected between the node 1 and a ground GND. Here, a gate of the N-MOS transistor N1 is connected to the node 2. On the other hand, the N-MOS transistor N1 should be sized large so that the well bias has a stable 0V because the well has a high capacitance. In this case, a common N-MOS transistor is employed as the N-MOS transistor N1.

The well discharging circuit 30 includes a fourth inverter IN4, a fifth inverter IN5, and a second snapback transistor Sb2.

The fourth and fifth inverters IN4, IN5 are connected in series between a discharge controlling signal DISCH terminal of the controller 40 and a node 3.

The second snapback transistor Sb2 is connected between the node 1 and the ground GND. Here, a gate of the second snapback transistor Sb2 is connected to the node 3.

The controller 40 outputs the discharge controlling signal DISCH for discharging the high voltage applied to the well in order to erase data in the memory, and the well to ground inverting signal WELLTOGND_N for controlling the well bias so that the well bias has 0V.

The well to ground inverting signal WELLTOGND_N is inverted by the first inverter IN1, and so a well to ground controlling signal WELLTOGND is generated. Subsequently, the well to ground controlling signal WELLTOGND is inputted into the well to ground circuit 20 through the second and third inverters IN2, IN3.

To erase data in the memory, the controller 40 outputs the well to ground inverting signal WELLTOGND_N having high level, and then the outputted well to ground inverting signal WELLTOGND_N is changed into the well to ground controlling signal WELLTOGND having low level through the first inverter IN1.

Subsequently, the well to ground controlling signal WELLTOGND is inputted to the well to ground circuit 20 via the second and third inverters IN2, IN3. As a result, the first N-MOS transistor N1 is turned off in accordance with the well to ground controlling signal WELLTOGND having low level. In addition, the switching controlling signal SW_HV is inputted to the gate of the first snapback transistor Sb1. In this case, the switching controlling signal SW_HV is provided from a high voltage switch (not shown) so as to apply the high voltage for erase.

In case that the switching controlling signal SW_HV has high level, the first snapback transistor Sb1 is turned on, and so the high voltage $V_{ERASE}$ is applied to the well through path a. Here, the high voltage $V_{ERASE}$ has different magnitudes in accordance with the characteristics of the memory, e.g. about 20V.

Level of the switching controlling signal SW_HV is converted into low level after data in the memory cell is erased by the high voltage VERSE applied to the well, and so the first snapback transistor Sb1 of the well voltage supplying circuit 10 is turned off. Additionally, the controller 40 outputs the discharge controlling signal DISCH having high level so as to discharge the high voltage $V_{ERASE}$ applied to the well.

The second snapback transistor Sb2 of the well discharging circuit 30 is turned on by the discharge controlling signal DISCH, and so discharge path b is formed to discharge the high voltage of the well connected to node 1.

The well bias circuit may have a problem when a power supply is turned on after being turned off during an erase operation. In this case, the controller 40 outputs the well to ground inverting signal WELLTOGND_N having low level when the power supply has on status. Accordingly, the well to ground controlling signal WELLTOGND has high level by the first inverter IN1, and so the N-MOS transistor N1 is turned on. As a result, the well bias has 0V.

However, since the power supply is turned off during the erase operation, the high voltage $V_{ERASE}$ is already applied to the well, and so the N-MOS transistor N1 may be damaged by the high voltage VERSE provided from the well.

Hereinafter, operation simulation of the well bias circuit will be described with reference to FIG. 2.

FIG. 2 is a view illustrating simulation result in accordance with discharging the well voltage in FIG. 1.

Referring to FIG. 2, a well to ground controlling signal SWDW_WELLTOGND of the controller 40 maintains high level during a power has on condition in accordance with a power on inverting signal PWRONEN_N. Accordingly, in case that the power supply is turned off during erase operation, the high voltage is provided from the well to the N-MOS transistor N1 of the well to ground circuit 20, and so the N-MOS transistor N1 may be damaged.

SUMMARY OF THE INVENTION

It is a feature of the present invention to provide a well bias circuit in a memory device and method of operating the same for discharging a high voltage applied to a well during a power on time of the memory, and then maintaining a well bias to have 0V in order to prevent the damage of the circuit.

A well bias circuit according to one embodiment of the present invention includes a well voltage supplying circuit configured to apply a high voltage to a well for erasing data in a memory cell; a well discharging circuit configured to discharge the high voltage applied to the well in accordance with a first controlling signal after the data in the memory cell is erased; a well to ground circuit configured to control the well bias to have a ground voltage in accordance with a second controlling signal; and a controlling circuit configured to activate the well discharging circuit for a predetermined time when a power is turned on.

The controlling circuit includes a controller configured to output the first and second controlling signals; a first MUX configured to output the first controlling signal or a power supply voltage in accordance with a signal generated when the power on is performed; and a second MUX configured to output the second controlling signal or the power supply voltage in accordance with the signal generated when the power on is performed.

The first MUX receives the first controlling signal and the power supply voltage, outputs the power supply voltage when the power on is performed, and outputs the first controlling signal after the power on is finished.

The second MUX receives the second controlling signal and the power supply voltage, outputs the power supply voltage when the power on is performed, and outputs the second controlling signal after the power on is finished.

A method of operating a well bias circuit in a memory device according to one embodiment of the present invention includes activating a well discharging circuit for discharging a voltage applied to a well in a memory cell when a power on is performed; and non-activating the well discharging circuit after the power on is finished, and activating a well to ground circuit so that the well bias has 0V.

As described above, a well bias circuit in a memory device and a method of operating the same of the present invention discharges a voltage of a well through a transistor for high voltage when a power is on, and then maintains a well bias to have 0V. As a result, the transistor is protected, and so an error is not occurred.

DESCRIPTION OF SPECIFIC EMBODIMENTS

Hereinafter, specific embodiments of the present invention will be explained in more detail with reference to the accompanying drawings.

Figure 1:
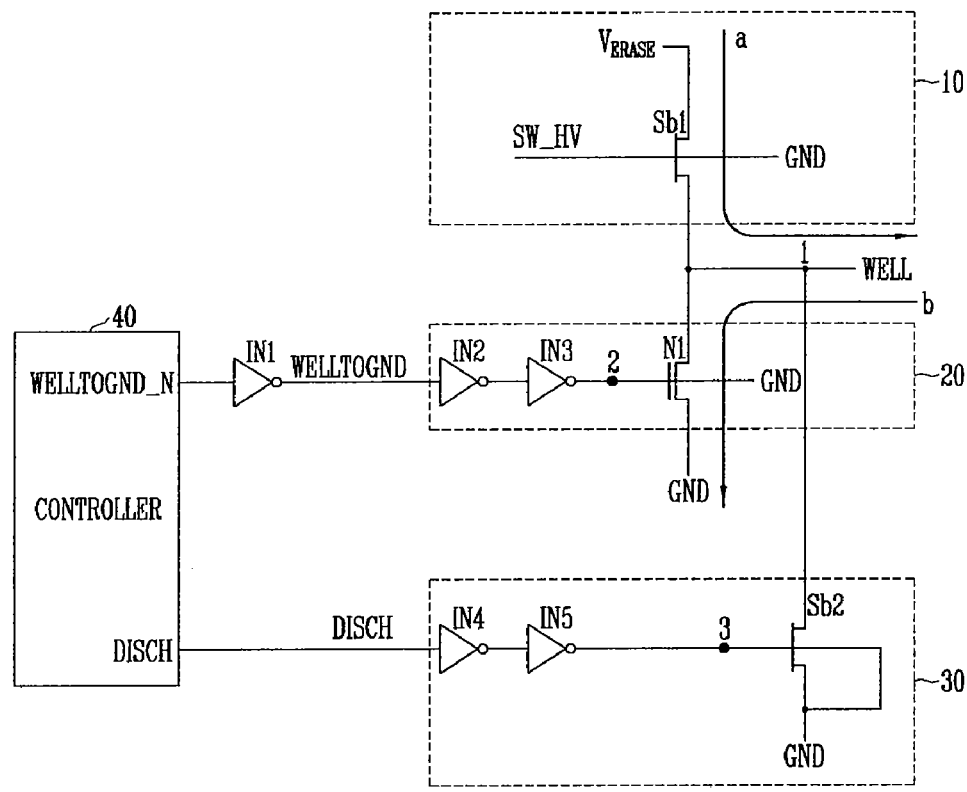
FIG. 1 is a view illustrating a common well bias circuit in the NAND flash memory.
Figure 2:
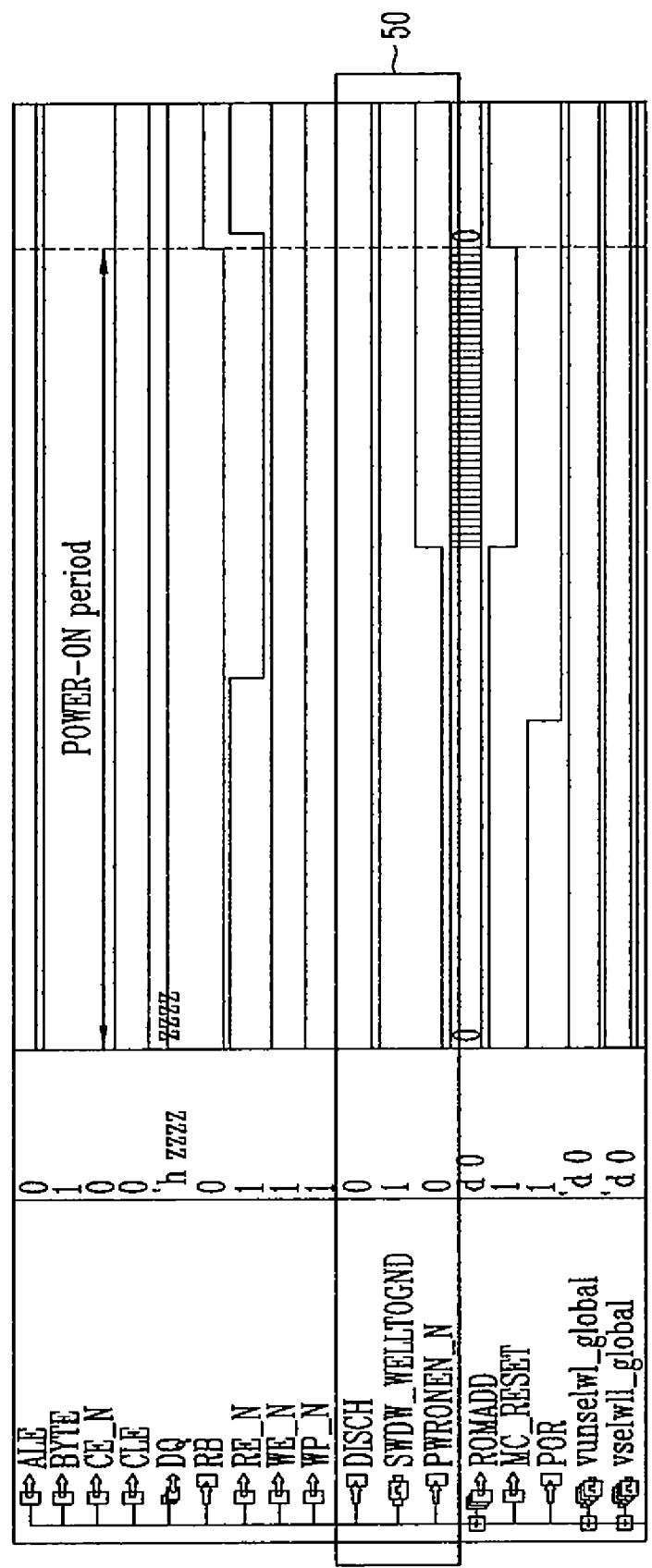
FIG. 2 is a view illustrating simulation result in accordance with discharging the well voltage in FIG. 1.
Figure 3:
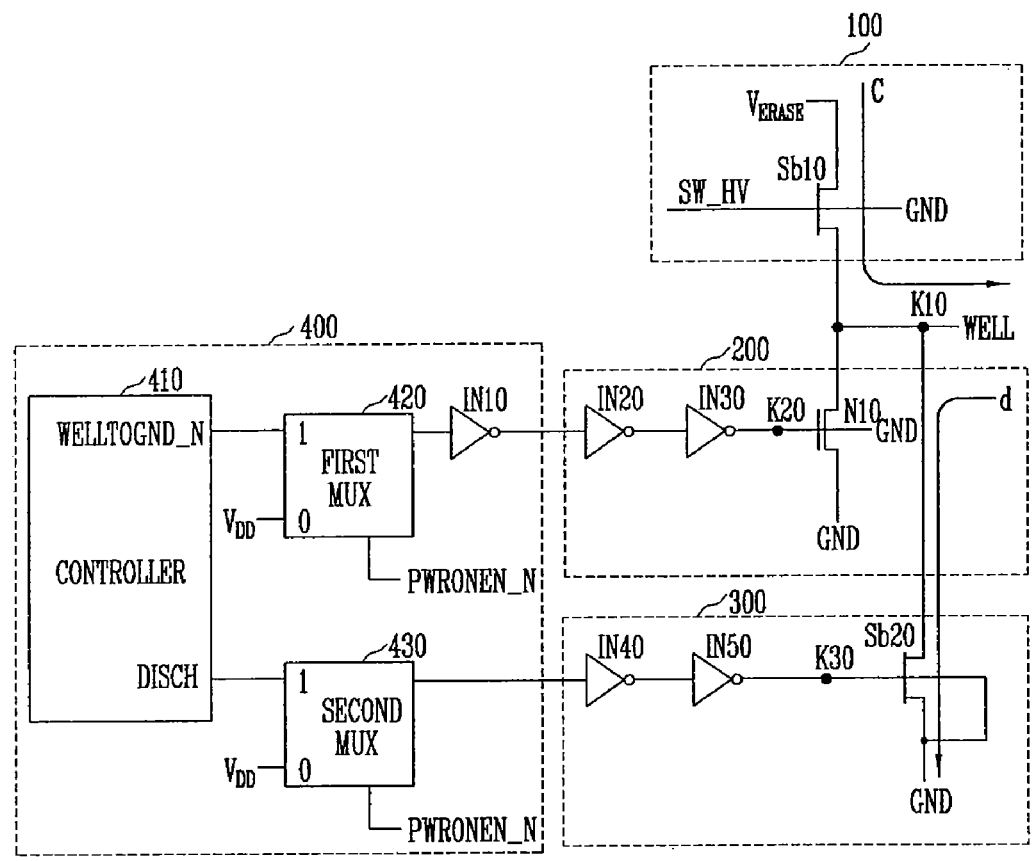
FIG. 3 is a view illustrating a circuitry of a well bias circuit in a memory device according to one embodiment of the present invention.

Referring to FIG. 3, the well bias circuit of the present embodiment includes a well voltage supplying circuit 100, a well to ground circuit 200, a well discharging circuit 300 and a controlling circuit 400. Here, the well voltage supplying circuit 100 supplies a well bias to a memory, and the well to ground circuit 200 controls the well bias so that the well bias has a ground voltage, e.g., 0V when an erasing operation is not performed. In addition, the well discharging circuit 300 provides a discharge path so that a high voltage supplied to the well from the well voltage supplying circuit 100 is discharged after the erasing operation, and the controlling circuit 400 outputs a controlling signal for controlling the operation of the well to ground circuit 200 and the well discharging circuit 300.

The well voltage supplying circuit 100 has a first snapback transistor Sb10 coupled between a voltage terminal having the high voltage $V_{ERASE}$ for erase and a node K10. Here, a switching control signal SW_HV is inputted to a gate of the first snapback transistor Sb10. In addition, the node K10 is coupled to a well in a NAND flash memory.

The well to ground circuit 200 includes a second inverter IN20, a third inverter IN30, and an N-MOS transistor N10.

The second and third inverters IN20, IN30 are coupled in series between a first inverter IN10 for inverting an output of a first multiplexer (MUX) 420 in the controlling circuit 400 and a node K20.

The N-MOS transistor N10 is coupled between the node K10 and a ground GND, and a gate thereof is coupled to the node K20. On the other hand, the N-MOS transistor N10 should be sized large so that the well bias has a stable 0V because the well has high capacitance. In this case, a common N-MOS transistor is employed as the N-MOS transistor N10.

The well discharging circuit 300 includes a fourth inverter IN40, a fifth inverter IN50, and a second snapback transistor Sb20.

The fourth and fifth inverters IN40, IN50 are coupled in series between an output terminal of a second MUX 430 in the controlling circuit 400 and a node K30. Here, the second snapback transistor Sb20 is coupled between the node K10 and the ground GND, and a gate thereof is coupled to the node K30.

The controlling circuit 400 includes a controller 410 for outputting a well to ground inverting signal WELLTOGND_N and a discharging controlling signal DISCH, the first and second MUXs 420, 430 operated by a power on inverting signal PWRONEN_N, and the first inverter IN10 for inverting the well to ground inverting signal WELLTOGND_N outputted from the controller 410. Here, the power on inverting signal PWRONEN_N has low level during power on, and has high level during a preparing time after the power on is finished.

The first or second MUX 420, 430 has two input terminals "1" and "0", and outputs one of two input signals in accordance with a controlling signal.

The well to ground inverting signal WELLTOGND_N is inputted to the input terminal 11111 of the first MUX 420, and a power supply voltage $V_{DD}$ is inputted to the input terminal "0" of the first MUX 420.

In addition, the first MUX 420 is controlled by the power on inverting signal PWRONEN_N. Here, a first signal corresponding to the input terminal 11111 is outputted from the first MUX 420 in case that the power on inverting signal PWRONEN_N has high level, and a second signal corresponding to the input terminal "0" is outputted from the first MUX 420 in case that the power on inverting signal PWRONEN_N has low level.

The discharging controlling signal DISCH is inputted to an input terminal "11" of the second MUX 430, and the power supply voltage $V_{DD}$ is inputted to an input terminal "0" of the second MUX 430. Further, the second MUX 430 is controlled by the power on inverting signal PWRONEN_N, and performs output operation like the first MUX 420.

Hereinafter, operation simulation of the well bias circuit will be described with reference to FIG. 4.

Figure 4:
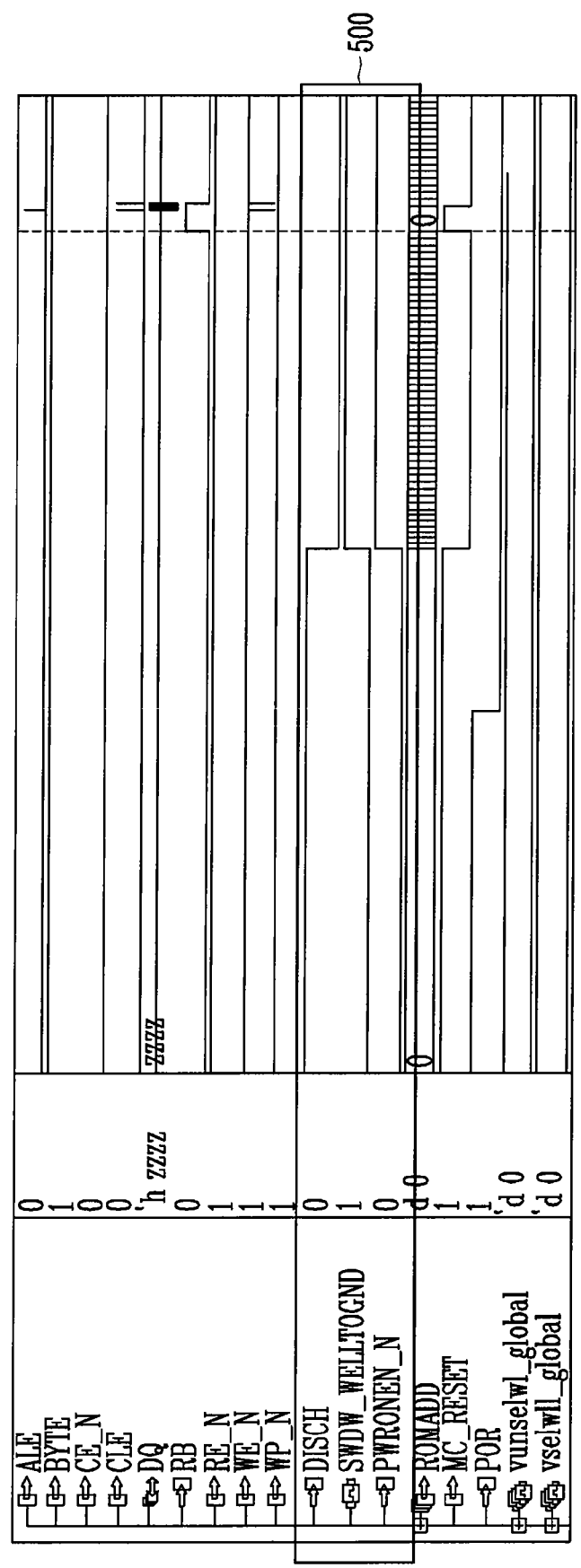
FIG. 4 is a view illustrating simulation result in accordance with discharging the well voltage in FIG. 3.

In FIG. 4, in case that the power on inverting signal PWRONEN_N has low level at an initial time, the first and second MUXs 420, 430 output the power supply voltage $V_{DD}$ inputted to the terminals "0". That is, the first and second MUXs 420, 430 output signals having high level corresponding to $V_{DD}$. Here, the signal outputted from the first MUX 420 is inverted to a low level by the first inverter IN10, and then inputted to the well to ground circuit 200. In addition, the signal outputted from the second MUX 430 is inputted to the well discharging circuit 300. As a result, the N-MOS transistor N10 of the well to ground circuit 200 is turned off in accordance with the input of the signal, and the second snapback transistor Sb20 of the well discharging circuit 300 is turned on in accordance with the input of the signal.

Accordingly, even though a power supply is turned off under a condition that the well has high voltage, the high voltage of the well is stably discharged through the second snapback transistor Sb20 during an initial time that the power supply is turned on so that the N-MOS transistor N10 of the well to ground circuit 200 is protected.

In case that the level of the power on inverting signal PWRONEN_N is converted into a high level, the well to ground inverting signal WELLTOGND_N and the discharging controlling signal DISCH inputted to the input terminals "1" of the first and second MUXs 420, 430 are outputted from the first and second MUXs 420, 430.

In this case, since the well to ground inverting signal WELLTOGND_N maintains a low level during the power on time, the signal inputted to the well to ground circuit 200 through the first inverter IN10 has high level, and so the N-MOS transistor N10 is turned on. Further, since the discharging controlling signal DISCH has low level, the second snapback transistor Sb20 of the well discharging circuit 300 is turned off. Accordingly, in case that the power on is finished, the well bias is coupled to the ground GND having 0V through the N-MOS transistor N10.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A well bias circuit in a memory device comprising:
a well voltage supplying circuit configured to apply a high voltage to a well for erasing data in a memory cell;
a well discharging circuit configured to discharge the high voltage applied to the well in accordance with a first control signal after the data in the memory cell is erased;
a well-to-ground circuit configured to control the well bias to obtain a ground voltage in accordance with a second control signal; and
a control circuit configured to activate the well discharging circuit for a predetermined time when power is turned on, wherein the control circuit comprises:
a controller configured to output the first and second control signals, and
a select circuit configured to select the first control signal or a power supply voltage and to select the second control signal or the power supply voltage.

2. The well bias circuit of claim 1, wherein the select circuit includes:
a first MUX configured to output the first control signal or the power supply voltage in accordance with a signal generated when the power is on; and
a second MUX configured to output the second control signal or the power supply voltage in accordance with the signal generated when the power is on.

3. The well bias circuit of claim 2, wherein the first MUX receives the first control signal and the power supply voltage, outputs the power supply voltage while a power-on is being performed, and outputs the first control signal after the power-on has been preformed.

4. The well bias circuit of claim 2, wherein the second MUX receives the second control signal and the power supply voltage, outputs the power supply voltage while a power-on is being performed, and outputs the second control signal after the power-on has been performed.

5. A method of operating a well bias circuit in a memory device comprising:

provuding the well bias circuit comprising a well discharging circuit for discharging a voltage charged on a well of a memory device and comprising a well-to-ground circuit to connect the well to ground;

deactivating the well-to-ground circuit for a predetermined time by a well-to-ground signal having a first level;

activating the well discharging circuit for the predetermined time by a discharge signal having a second level when power is turned on;

activating the well-to-ground circuit by the well-to-ground signal having the second level; and deactivating the well discharging circuit by the discharge signal having the first level after the predetermined time.

* * * * *